United States Patent [19]

Geis

[11] Patent Number: 4,804,611
[45] Date of Patent: Feb. 14, 1989

[54] METHOD FOR REDUCING SHORT TIME-SCALE RECIPROCITY FAILURE EFFECTS OF A MICROENCAPSULATED ACRYLATE SYSTEM

[75] Inventor: Timothy R. Geis, Centerville, Ohio

[73] Assignee: The Mead Corporation, Dayton, Ohio

[21] Appl. No.: 65,972

[22] Filed: Jun. 24, 1987

[51] Int. Cl.$^4$ .................................................. G03C 1/72
[52] U.S. Cl. ...................................... 430/138; 430/281; 430/288; 430/292; 430/327; 430/494
[58] Field of Search ............... 430/138, 327, 494, 281, 430/288, 292

[56] References Cited

U.S. PATENT DOCUMENTS

| | | | |
|---|---|---|---|
| 3,351,948 | 11/1967 | Bonn | 346/76 |
| 4,214,249 | 7/1980 | Kasai et al. | 346/76 |
| 4,248,959 | 2/1981 | Jeffers et al. | 430/300 |
| 4,257,053 | 3/1981 | Gilbreath | 346/108 |
| 4,314,256 | 2/1982 | Petrov et al. | 346/1.1 |
| 4,375,063 | 2/1983 | Kitamura | 346/108 |
| 4,383,029 | 5/1983 | Yamada et al. | 430/541 |
| 4,383,326 | 5/1983 | Noguchi | 346/1.1 |
| 4,399,209 | 8/1983 | Sanders et al. | 430/138 |
| 4,420,761 | 12/1983 | Kitamura | 346/108 |
| 4,440,846 | 4/1984 | Sanders et al. | 430/138 |
| 4,490,730 | 12/1984 | Youmans | 346/76 |
| 4,529,681 | 7/1985 | Usani et al. | 430/138 |
| 4,535,342 | 8/1985 | Ohara et al. | 346/108 |
| 4,614,951 | 9/1986 | Osato et al. | 346/35.1 |
| 4,617,578 | 10/1986 | Nezu et al. | 346/108 |
| 4,619,894 | 10/1986 | Bozler et al. | 430/942 |
| 4,621,040 | 11/1986 | Viola | 430/138 |
| 4,672,014 | 6/1987 | Joiner et al. | 430/138 |

OTHER PUBLICATIONS

Journal of Imaging Science, vol. 31, No. 1, 1987–"Oxidation Kinetics and Reciprocity Behavior in the Microencapsulated Acrylate Imaging Process", Jonathan S. Arney–pp. 27–30.

Primary Examiner—Jack P. Brammer
Attorney, Agent, or Firm—Biebel, French & Nauman

[57] ABSTRACT

The present invention provides a method for reducing short time-scale reciprocity failure effects of a photosensitive imaging sheet. The photosensitive imaging sheet comprises a substrate having a layer of microcapsules on one surface thereof. The microcapsules contain an internal phase of an acrylate monomer, photoinitiator, and color former. A portion of the microcapsules of the imaging sheet is image-wise exposed to high intensity light and then allowed to recover from the exposure. The exposure and recovery steps are repeated to form a latent image. By pulsing the light onto the photosensitive imaging sheet, the total exposure energy required per unit area is significantly reduced compared to the known short time-scale exposure method.

18 Claims, 2 Drawing Sheets

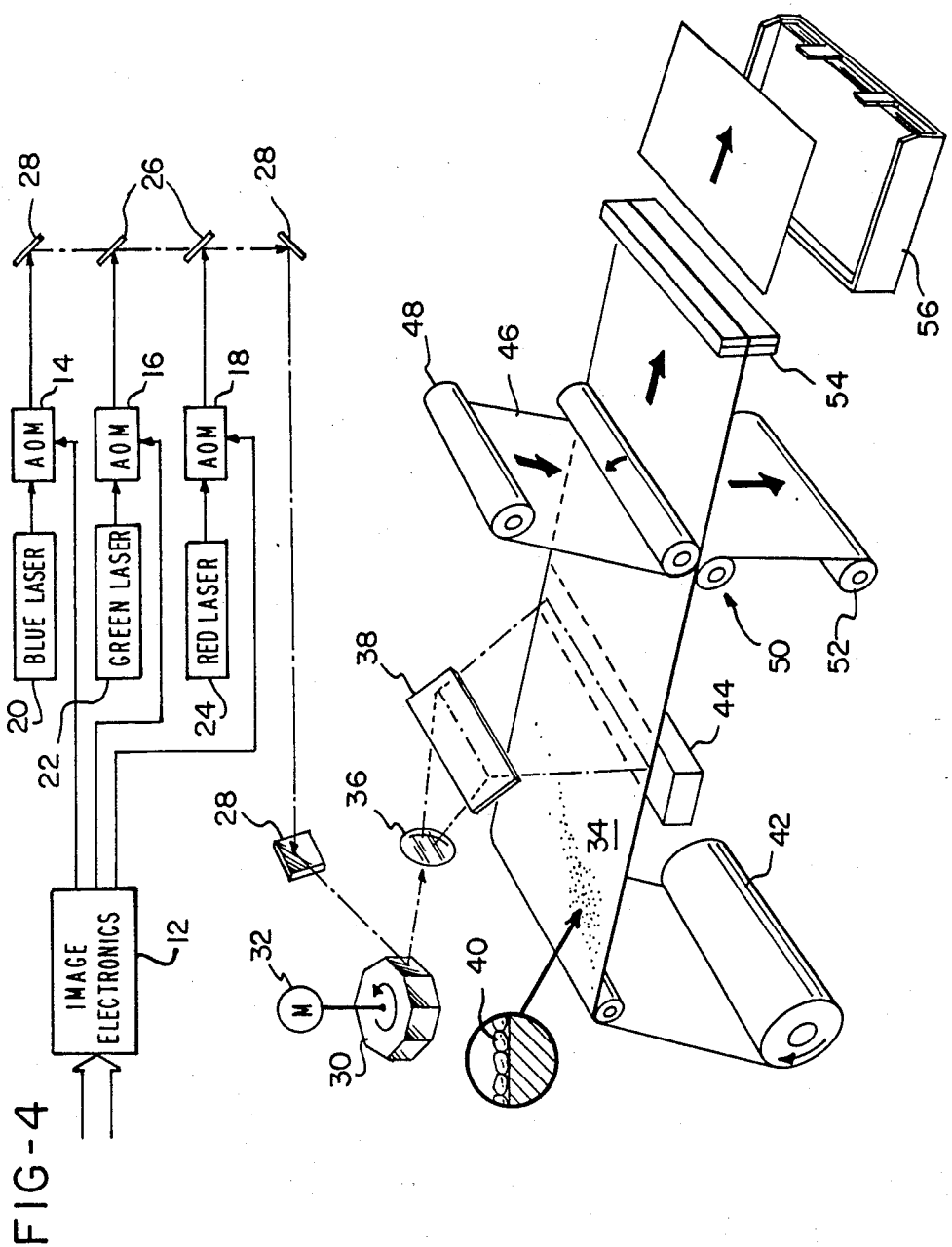

METHOD FOR REDUCING SHORT TIME-SCALE RECIPROCITY FAILURE EFFECTS OF A MICROENCAPSULATED ACRYLATE SYSTEM

BACKGROUND OF THE INVENTION

The present invention relates to a method for reducing short time-scale reciprocity failure effects of a microencapsulated acrylate system.

Reciprocity failure may be exhibited by photographic materials. For a photographic system to obey reciprocity, the photographic system must produce the same image density with either an exposure to a high intensity light for a short exposure time or an exposure to a low intensity light for a long exposure time, providing that the total exposure energy is the same in both cases. If the photographic material fails to behave in this manner, the photographic material is said to suffer from "reciprocity failure."

Short time-scale reciprocity failure occurs in imaging systems such as those disclosed in commonly assigned U.S. Pat. Nos. 4,399,209 and 4,440,846. In these imaging systems, the imaging sheet comprises a support with a layer of microcapsules on the surface thereof. The microcapsules have an internal phase of a photohardenable photosensitive composition and color former. The microcapsules are image-wise exposed to actinic radiation and ruptured so that the color former reacts with a developer material to produce an image.

The photohardenable photosensitive composition can be described as having a viscosity which changes upon exposure to actinic radiation such that upon exposure, a change in the viscosity of the internal phase in the exposed areas occurs which image-wise determines whether the color former is accessible to the developer material. Typically, the photohardenable photosensitive composition is a radiation curable composition which, upon exposure to light, increases in viscosity and immobilizes the color former therein to prevent the color former from transferring to the developer sheet and reacting with the developer material entirely. As such, a latent image is formed in the unexposed microcapsules because upon microcapsule rupture, the color former is transferred to the developer sheet where it reacts with the developer material entirely.

In the transfer imaging system of U.S. Pat. No. 4,399,209, the imaging sheet is contacted with a developer sheet comprising a support with a layer of developer material on the surface thereof prior to microcapsule rupture. In the self-contained imaging system of U.S. Pat. No. 4,440,846, the imaging sheet has developer material co-deposited with the microcapsules on the surface thereof.

In Arney, "Oxidation Kinetics and Reciprocity Behavior in the Microencapsulated Acrylate Imaging Process," J. of Imaging Science, 31, 27 (1987), the short time-scale reciprocity failure effects of the aforementioned imaging systems were reported. According to Arney, the aforementioned microencapsulated acrylate system obeys reciprocity over the time range of about $10^{-2}$ to 10 seconds. In other words, the total exposure energy required to produce the same image density, whether by an exposure to a high intensity light for $10^{-2}$ second, an exposure to a low intensity light for 10 seconds, or an exposure in between, remains constant over this time range.

Below about $10^{-2}$ second, the total exposure energy required to produce the same image density as generated in the $10^{-2}$ to 10 seconds range is much higher. Otherwise, a loss of media sensitivity is observed. As such, the microencapsulated acrylate system is said to suffer from "short time-scale reciprocity failure." Thus, very high intensity light is required at low exposure times, i.e., below $10^{-2}$ second, in order to generate the higher exposure energy required to achieve the same image density as in the $10^{-2}$ to 10 seconds time range. It is believed that short time-scale reciprocity failure is due to a decrease in the oxidation efficiency resulting from competing processes of free radical termination.

Situations exist where short time exposure of photosensitive materials is desirable. As an example of the use of a short time exposure, see U.S. Pat. No. 4,314,256. Thus, the need exists in the art for a method for reducing the short time-scale reciprocity failure effects of the microencapsulated acrylate imaging material.

SUMMARY OF THE INVENTION

The present invention provides a method for reducing short time-scale reciprocity failure effects of a microencapsulated acrylate system. It has been found that by taking the currently used exposure method of a continuous short time/high intensity exposure and breaking the exposure up into pulses, i.e., exposing the microcapsules for a very short time to high intensity light, allowing the microcapsules to recover from the exposure, and repeating the exposure and recovery steps, a lower actual exposure time is required by the present invention in order to achieve an image density comparable to that obtained with the currently used exposure method of a continuous short time/high intensity exposure. It is believed that the recovery period allows the chemical system of the internal phase of the microcapsules to recover. In other words, the microcapsule photoinitiator chemistry functions more efficiently with time for the reactions to occur between successive exposures which is similar to a long time/low intensity exposure. As a result of the lower actual exposure time due to the intermittent exposures, the present method provides a comparable image density at a lower total exposure energy or a higher sensitivity so as to reduce short time-scale reciprocity failure effects of the microencapsulated acrylate system.

Practically speaking, the method of the present invention involves a photosensitive imaging sheet comprising a substrate having a layer of microcapsules on one surface thereof. The microcapsules contain an internal phase of an acrylate monomer, photoinitiator, and color former. A portion of the microcapsules of the imaging sheet is image-wise exposed for a very short time to high intensity light. The exposed microcapsules are then allowed to recover from the exposure. The exposure and recovery steps are repeated to form a latent image.

In another embodiment, the present invention provides a method for reducing short time-scale reciprocity failure effects of the aforementioned photosensitive imaging sheet wherein at least one acousto-optic modulator is image-wise signaled. Three acousto-optic modulators may be used to independently control one of three lasers wherein the lasers are blue, green, and red respectively. The microcapsules in the pixels of a scan-line of the imaging sheet are exposed to scanning light from the lasers. The exposed microcapsules are allowed to recover from the exposure.

The exposure and recovery steps are repeated to form a latent image on the scanline. The imaging sheet is then advanced to the next scanline wherein the exposure, recovery, and repeating steps are repeated. After the preceding step is repeated so as to form a latent image over an area of the imaging sheet, pressure is applied to the imaging sheet such that a full color image is formed.

The present method also allows the microencapsulated acrylate system to be directly written upon using a laser beam.

Thus, an object of the present invention is to provide a method for reducing short time-scale reciprocity failure effects of a microencapsulated acrylate imaging system.

A more particular object of the present invention is to provide a method which reduces the short time-scale reciprocity failure effects of a microencapsulated acrylate imaging system by pulsing high intensity light onto the imaging sheet.

A further object of the present invention is to provide a method which allows direct writing by a laser beam on a microencapsulated acrylate imaging system.

Other objects and advantages of the present invention will become apparent from the following description, attached drawings, and appended claims.

BRIEF DESCRIPTION OF THE DRAWINGS

FIG. 4 is an illustration of one embodiment in accordance with the present invention for reducing short time-scale reciprocity failure effects of a microencapsulated acrylate imaging system.

DETAILED DESCRIPTION OF THE INVENTION

Figure 1:
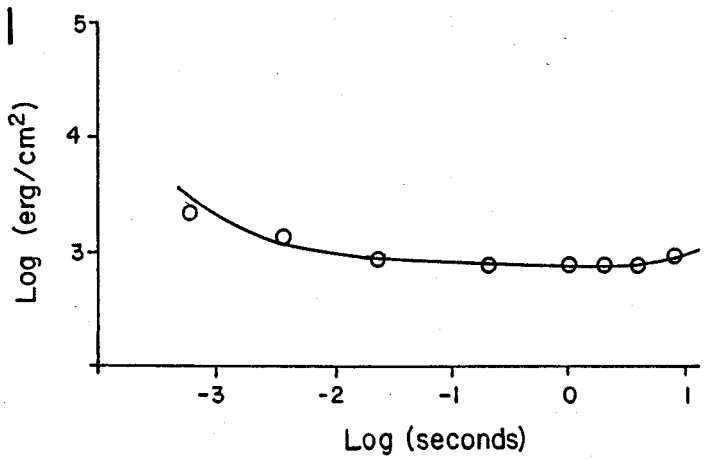
FIG. 1 is a graphic illustration of the reciprocity behavior of the microencapsulated acrylate system.

The present invention provides a method for reducing short time-scale reciprocity failure effects of a microencapsulated acrylate system. As determined by Arney, referred to earlier herein, FIG. 1 illustrates the reciprocity behavior of the microencapsulated acrylate system as the exposure energy to a first detectable change in image density versus the exposure time. As shown in FIG. 1, reciprocity is obeyed along the linear portion of the curve, within the time range for exposures of about $10^{-2}$ to 10 seconds.

The total exposure energy E required, when exposing a photosensitive material, can be calculated by the following Equation (1):

$$E = (I)(t)$$

where I is exposure intensity and t is exposure time. Within the time range where reciprocity is obeyed, the total exposure energy required to produce a first detectable change in image density remains constant; in other words, exposure intensity and exposure time are indirectly proportional. Below about $10^{-2}$ second (i.e., short time-scale), reciprocity is not obeyed because the total exposure energy required to produce a first detectable change in image density is much higher as shown in FIG. 1.

Figure 2:
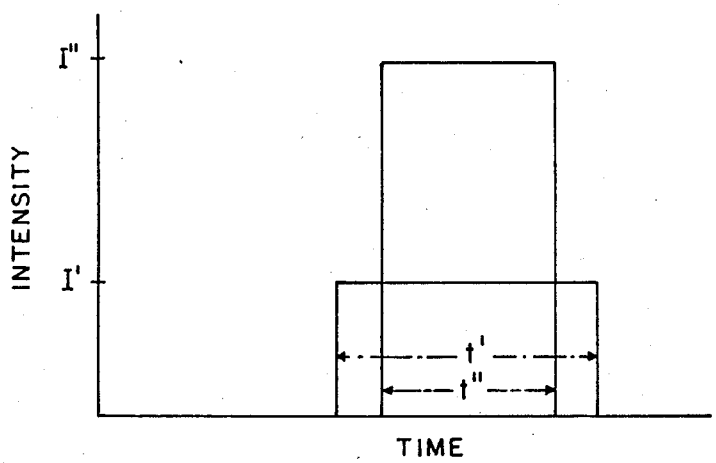
FIG. 2 is a graphic illustration of the currently used exposure methods.

FIG. 2 graphically illustrates the exposure conditions for the currently used methods within and outside the reciprocity obeyed range. In FIG. 2, exposure time is plotted on the abscissa while exposure intensity is plotted on the ordinate. Within the reciprocity obeyed range, a representative example of exposure conditions is illustrated by an exposure intensity I' and an exposure time t'; based on Equation (1) above, the total exposure energy E' can be calculated by the following Equation (2):

$$E' = (I')(t')$$

which is also the area under the plot. It should be understood that while any combination of I' and t' within the reciprocity obeyed range can provide the same E', only one combination is illustrated for simplification purposes.

Outside the reciprocity obeyed range below about $10^{-2}$ second (i.e., short time-scale), a representative example of exposure conditions is illustrated by an exposure intensity I'' and an exposure time t''; based on Equation (1) above, the total exposure energy E'' can be calculated by the following Equation (3):

$$E'' = (I'')(t'')$$

which is also the area under the plot. Based on the areas under the plots of FIG. 2, the relationship which exists between the total exposure energy E' which is required in the reciprocity obeyed range and the total exposure energy E'' which is required below about $10^{-2}$ second can be represented by the following Inequality (1):

$$E' < E''.$$

In sum, the total exposure energy E'', which is required in the short time-scale, is much higher than the constant total exposure energy E' which is required in the reciprocity obeyed range.

Figure 3:
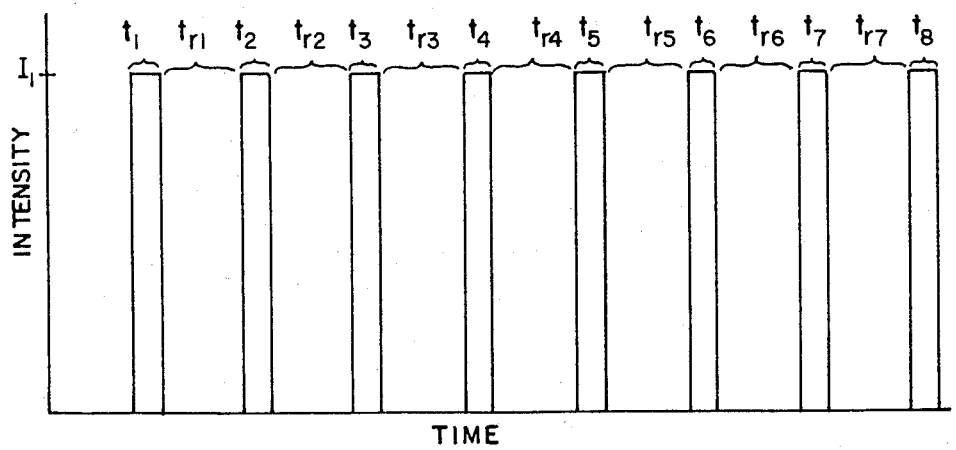
FIG. 3 is a graphic illustration of the method of the present invention.

The method of the present invention involves taking the currently used exposure method of a continuous short time/high intensity exposure as illustrated in FIG. 2 and breaking the exposure up into pulses as illustrated in FIG. 3. More specifically, the present method involves exposing microcapsules for a very short time to a high exposure intensity, comparable to the theoretical intensity predicted by Eq. (1) for the desired total exposure time. The microcapsules are then allowed to recover from the exposure. It is believed that the recovery period allows the chemical system of the internal phase of the microcapsules to recover from the exposure. The same microcapsules are again exposed for a similar very short time to a similar high exposure intensity and then allowed to recover from the exposure. The exposure and recovery steps are repeated to form a latent image.

It has been found that as a result of the intermittent pulses, a lower actual exposure time is required by the present invention in order to achieve the image density obtained with the currently used exposure method of a continuous short time/high intensity exposure as illustrated in FIG. 2. Alternatively, a lower intensity exposure can be used. As a result of the lower actual exposure time, the present method provides a comparable image density at a lower total exposure energy or a higher sensitivity than required by the currently used continuous short time/high intensity exposure method as illustrated in FIG. 2 so as to reduce short time-scale reciprocity failure effects of the microencapsulated acrylate system.

FIG. 3 graphically illustrates the method of the present invention. In FIG. 3, exposure time is plotted on the abscissa while exposure intensity is plotted on the ordinate. The microcapsules are exposed for an exposure time $t_1$, which is very short, to an exposure intensity $I_1$, which is very high. It should be understood that $t_1$ in FIG. 3 is much lower in magnitude than $t''$ in FIG. 2. It should also be understood that the plots of FIGS. 2 and 3 are not drawn to scale but merely illustrate schematically the differences between the known methods and the method of the present invention. The microcapsules are then allowed to recover from the exposure for a time $t_{r1}$ as illustrated in FIG. 3.

The same microcapsules are again exposed for an exposure time $t_2$, which is very short, to the same exposure intensity $I_1$ and allowed to recover from the exposure for a time $t_{r2}$. The same microcapsules are again exposed for an exposure time $t_3$, which is very short, to the same exposure intensity $I_1$ and allowed to recover from the exposure for a time $t_{r3}$. As illustrated in FIG. 3, the exposure and recovery steps are repeated to form a latent image in the microcapsulated acrylate system.

It has been found that the relationship which exists in the short time-scale between the actual exposure time as illustrated in FIG. 2 and the actual exposure time of the present method as illustrated in FIG. 3, assuming comparable intensities, can be represented by the following Inequality (2):

$$t'' > t_1 + t_2 + t_3 + t_4 \ldots$$

where $t''$ is the actual exposure time required by the currently used exposure method of a continuous short time/high intensity exposure and $t_1 + t_2 + t_3 + t_4 \ldots$ represents the actual exposure time required by the present method. Thus, to produce the same image density as the currently used exposure method, the present method requires a lower total exposure time. It should be understood that the relationship which exists between the total method time of FIG. 2 and the total method time of the present method as illustrated in FIG. 3 can be represented by the following Inequality (3):

$$t'' < t_1 + t_{r1} + t_2 + t_{r2} + t_3 + t_{r3} + \ldots$$

where $t''$ is the total method time which is required by the currently used method of a continuous short time/high intensity exposure and $t_1 + t_{r1} + t_2 + t_{r2} + t_3 + t_{r3} + \ldots$ represents the total method time which is required by the present method.

As a result of the lower actual exposure time, the present method provides the same image density, as achieved with the currently used method of a continuous short time/high intensity exposure, at a total exposure energy $E_1$ which can be calculated by the following Equation (4):

$$E_1 = (I_1)(t_1 + t_2 + t_3 + t_4 \ldots).$$

Based on Equation (4) above, the areas under the plots, i.e., $(I_1)(t_1) + (I_1)(t_2) + (I_1)(t_3) \ldots$, can be added together to roughly calculate the total exposure energy $E_1$.

Assuming comparable intensities and based on Inequality (2) above, the relationship which exists between the total exposure energy $E_1$ which is required by the present method and the total exposure energy $E''$ which is required in the short time-scale can be represented by the following Inequality (4):

$$E_1 < E''.$$

Thus, to produce the same image density as the currently used method of a continuous short time/high intensity exposure, the present method requires a lower total exposure energy so as to reduce the short time-scale reciprocity failure effects of the microencapsulated acrylate system. Note that even though recovery time has been added, the present method deals with extremely short times, i.e., less than $10^{-2}$ second.

Having discussed the theory behind the method of the present invention, the practicalities will now be discussed. Useful imaging sheet substrates, microcapsule wall-forming materials, encapsulation techniques, and color formers are disclosed in commonly assigned U.S. Pat. Nos. 4,399,209; 4,440,846; and U.S. application Ser. No. 339,917 filed Jan. 18, 1982 which are incorporated herein by reference. Useful acrylate monomers are ethylene glycol dimethacrylate, triethylene glycol dimethacrylate, trimethylol propane triacrylate, and trimethylol propane trimethacrylate. A preferred acrylate monomer is trimethylol propane triacrylate.

Examples of photoinitiators useful in the present invention include diaryl ketone derivatives and benzoin alkyl ethers. More specific examples of useful photoinitiators include alpha-alkoxy phenyl ketones, o-acylated alpha-oximinoketones, polycyclic quinones, benzophenones and substituted benzophenones, xanthones, thioxanthones, halogenated compounds such as chlorosulfonyl and chloromethyl polynuclear aromatic compounds, chlorosulfonyl and chloromethyl heterocyclic compounds, chlorosulfonyl and chloromethyl benzophenones and fluorenones, haloalkanes, and combinations thereof. It is also possible to add sensitizers such as Michler's ketone.

In practicing the method of the present invention, a portion of the microcapsules of the imaging sheet is image-wise exposed for a very short time to high intensity light. The term "image-wise" as used herein means that upon exposure and transfer, the color former and a developer material react to form an image of the original. The time for each exposure remains substantially constant throughout the method. Typically, the time for each exposure is about 1 to 100 microseconds, and preferably, about 1 to 10 microseconds.

Preferably, the high intensity light source is a laser. Lasers useful in the present invention are commercially available. Throughout the method, the intensity I remains substantially constant. Typically, the intensity I is about 1,000 to 50,000 watts/cm$^2$, and preferably, about 10,000 to 50,000 watts/cm$^2$.

The exposed microcapsules are then allowed to recover from the exposure. As stated earlier, it is believed that the recovery time allows the chemical system of the internal phase of the microcapsules to relax. Throughout the method, the time for each recovery remains substantially constant. Typically, the time for each recovery is about 1 to 100 milliseconds, and preferably, about 1 to 10 milliseconds.

The exposure and recovery steps are repeated to form a latent image. Typically, the exposure and recovery steps are repeated for about 5 to 20 times, and preferably, about 5 to 10 times.

As discussed earlier, image-wise exposure of a portion of the microcapsules causes the photohardenable photosensitive composition to increase in viscosity and immobilize the color former; as such, the color former is prevented from transferring to the developer sheet and reacting with the developer material entirely. In the unexposed microcapsules where the latent image is formed, upon microcapsule rupture, the color former is transferred to the developer sheet and reacts with the developer material entirely. The method of the present invention can be used to form full color as well as monochromatic images.

In another embodiment, the step of image-wise exposing a portion of the microcapsules of the imaging sheet to high intensity light comprises image-wise exposing the portion of microcapsules to blue, green, or red laser. The imaging sheet can then be developed to form a full color image.

FIG. 4 illustrates one apparatus useful in carrying out the method of the present invention. Image electronics 12 controls acousto-optic modulators 14, 16 and 18. Acousto-optic modulators useful in the present invention are commercially available. Each acousto-optic modulator independently controls one of three lasers. Acousto-optic modulator 14 controls a first laser 20 such as blue. Acousto-optic modulator 16 controls a second laser 22 such as green while acousto-optic modulator 18 controls a third laser 24 such as red.

The three beams from blue laser 20, green laser 22, and red laser 24 are combined by half-silvered mirrors 26 and directed by mirrors 28 to a rotating polygon mirror 30 which is driven by a high speed synchronous motor 32. Each facet of the rotating polygon mirror 30 causes the three colinear beams to be scanned across the full width of the photosensitive imaging material 34. The laser beams from the rotating mirror 30 are corrected for flat field scanning by lens 36 and reflected to the photosensitive imaging material 34 by mirror 38.

To briefly summarize the use of the apparatus as shown in FIG. 4 in one embodiment of the present invention, a photosensitive imaging material 34 in web form is typically used. The photosensitive imaging material 34 comprises a substrate having a layer of microcapsules 40 on one surface thereof. The microcapsules 40 contain an internal phase of an acrylate monomer, photoinitiator, and color former. It should be understood that in the method of the present invention, the surface of the photosensitive material 34 having the layer of microcapsules 40 thereon is adjacent to the optics system.

The photosensitive material 34 remains stationary during the exposure and recovery steps of the present invention. After the image electronics 12 has received input on the image to be generated, the image electronics 12 supplies the appropriate electrical signals to the three acousto-optic modulators 14, 16, and 18. As stated earlier, each acousto-optic modulator independently controls one of the three lasers 20, 22, and 24. The microcapsules 40 in the pixels of a scanline of the imaging material 34 are exposed to the light from the three lasers. For example, depending upon the image input, the first pixel of a scanline may be exposed to blue laser 20 while the next pixel is exposed to the green laser 22 and the following pixel is exposed to red laser 24.

The exposed microcapsules are then allowed to recover from the exposure. The exposure and recovery steps are then repeated to form a latent image on the scanline. Typically, each scanline is swept by laser light N times with the same image data. As such, if a given pixel is to be exposed, the pixel is exposed N times. Typically, each pixel is exposed for about 0.01 to 0.1% of the total exposure time for the scanline. Typically, N ranges from about 5 to 20, and preferably, from about 5 to 10. This method allows single operation imaging, i.e., masks are not required.

After the scanline is swept N times, the photosensitive imaging material 34 which is fed from supply roll 42 is then advanced or stepped so that the next scanline is positioned at the exposure station 44. The foregoing exposure and recovery steps are repeated to form a latent image on this scanline. The photosensitive imaging material 34 is again advanced to the next scanline position. The foregoing steps are repeated over a given area of the photosensitive imaging material 34 to form the desired latent image.

As the desired latent image is being formed at exposure station 44, the exposed photosensitive imaging material 34 is joined with receiver paper 46 from supply roll 48. The receiver paper 46 used in the present invention may be developer paper which carries a layer of a reactant such as developer resin which reacts with the color former released from the microcapsules to produce a color image. Alternatively, the receiver paper 46 may be plain bond paper which receives a colored dye released from the microcapsules 40 from a self-contained imaging material. Preferred developer resins are disclosed in commonly assigned U.S. application Ser. No. 905,727, filed Sept. 9, 1986. The mated receiver paper 46 and imaging material 34 are pressure developed in pressure development apparatus 50. Useful pressure development apparatus are disclosed in commonly assigned U.S. application Ser. Nos. 009,851, filed Feb. 2, 1987, and 039,393, filed Apr. 16, 1987. Upon microcapsule rupture, the color former and the developer material react to produce an image.

The used imaging material 34 is gathered on roll 52 while the receiver paper 46 can be glossed, cut at cutter 54, and stacked for further use in container 56. It should be understood that conventional sheet handling and conveying techniques can be used in the method of the present invention. While FIG. 4 illustrates an embodiment in which the receiver paper 46 is supplied in the form of a continuous web which is cut or separated at 54, those skilled in the art will appreciate that individual receiver sheets can be fed into contact with the photosensitive imaging material 34. A variety of combinations of roller drive mechanisms, catchers, and other finishing apparatus are useful herein.

Having described the invention in detail and by reference to preferred embodiments thereof, it will be apparent that modifications and variations are possible without departing from the scope of the invention defined in the appended claims.

What is claimed is:

1. A method for reducing short time-scale reciprocity failure effects of a photosensitive imaging sheet, wherein:

said photosensitive imaging sheet comprises a substrate having a layer of microcapsules coated on one surface thereof, said microcapsules having an outer phase transmissive to exposure light containing an internal phase of an acrylate monomer, photoinitiator, and color former;

said imaging sheet obeying reciprocity within a range of exposure times t having a lower limit of about $10^{-2}$ seconds, such that the required exposure energy for a given exposure density is a constant value $E_c$ such that $tI=E_c$, and wherein said imaging sheet exhibits short time-scale reciprocity failure below said range such that $tI>E_c$ whereby greater energy $E'$ is required to expose said image sheet at exposure times below said range than within said range;

the method comprising the steps of:

image-wise exposing a portion of said microcapsules of said imaging sheet for a time period $t_1$ to exposure light of an intensity I;

following exposure, providing a recovery period of a time $t_{r1}$ for said exposed microcapsules;

image-wise exposing a portion of said microcapsules of said imaging sheet for a time period $t_2$ to exposure light of an intensity I;

following exposure, providing a recovery period of a time $t_{r2}$ for said exposed microcapsules; and repeating said exposure and recovery steps n times to form a latent image;

said time periods $t_1, t_2, \ldots t_n$ being selected such that $E' > (t_1+t_2+ \ldots +t_n)I \geq E_c$, and such that $(t_1+t_2+ \ldots +t_n)$ is less than about $10^{-2}$ seconds.

2. The method of claim 1, wherein n is from about 5 to 20.

3. The method of claim 1, wherein said exposure time periods $t_1, t_2, \ldots t_n$ are substantially equal.

4. The method of claim 3, wherein said exposure time periods $t_1, t_2, \ldots t_n$ are from about 1 to 100 microseconds.

5. The method of claim 1, wherein said recovery periods $t_{r1}, t_{r2}, \ldots t_{rn}$ are substantially equal.

6. The method of claim 5, wherein said recovery periods $t_{r1}, t_{r2}, \ldots t_{rn}$ are between about 1 and 100 milliseconds.

7. The method of claim 1, wherein said intensity for each exposure is substantially constant throughout said method.

8. The method of claim 7, wherein said intensity for each exposure is about 1,000 to 50,000 watts/cm².

9. The method of claim 1, wherein said step of image-wise exposing said portion of said microcapsules to exposure light comprises image-wise exposing said portion of said microcapsules to blue, green or red laser light.

10. The method of claim 1, comprising the further step of, following said exposure and said recovery steps, applying pressure to said imaging sheet to rupture said microcapsules to develop said latent image into a visible image.

11. A method for reducing short time-scale reciprocity failure effects of a photosensitive imaging sheet, wherein:

said photosensitive imaging sheet comprises a substrate having a layer of microcapsules coated on one surface thereof, said microcapsules having an outer phase transmissive to exposure light containing an internal phase of an acrylate monomer, photoinitiator, and color former;

said imaging sheet obeying reciprocity within a range of exposure times t having a lower limit of about $10^{-2}$ seconds, such that the required exposure energy for a given exposure density is a constant value $E_c$ such that $tI=E_c$, and wherein said imaging sheet exhibits short time-scale reciprocity failure below said range such that $tI>E_c$ whereby greater energy $E'$ is required to expose said image sheet at exposure times below said range than within said range;

the method comprising the steps of:

(a) image-wise signalling at least one acousto-optic modulator wherein said acousto-optic modulators independently control one of three lasers wherein said lasers are blue, green and red;

(b) exposing said microcapsules in the pixels of a scanline of said imaging sheet for a time period $t_1$ to exposure light from said lasers of an intensity I;

(c) following exposure, providing a recovery period of a time $t_{r1}$ for said exposed microcapsules;

(d) exposing said microcapsules in said pixels of said scanline for a time period $t_2$ to exposure light from said lasers of an intensity I;

(e) following exposure, providing a recovery period of a time $t_{r2}$ for said exposed microcapsules;

(f) repeating said exposure and recovery steps n times to form a latent image on said scanline;

said time periods $t_1, t_2, \ldots t_n$ being selected such that $E' > (t_1+t_2+ \ldots +t_n)I \geq E_c$, and such that $(t_1+t_2+ \ldots +t_n)$ is less than about $10^{-2}$ seconds;

(g) advancing said imaging sheet and repeating steps (b) through (f) to form a latent image on a next succeeding scanline;

(h) repeating step (g) to completely expose said imaging sheet; and (i) applying pressure to said imaging sheet such that a full color image is formed.

12. The method of claim 11, wherein n is from about 5 to 20.

13. The method of claim 11, wherein said exposure time periods $t_1, t_2, \ldots t_n$ are substantially equal.

14. The method of claim 13, wherein said exposure time periods $t_1, t_2, \ldots t_n$ are from about 1 to 100 microseconds.

15. The method of claim 11, wherein said recovery periods $t_{r1}, t_{r2}, \ldots t_{rn}$ are substantially equal.

16. The method of claim 15, wherein said recovery periods $t_{r1}, t_{r2}, \ldots t_{rn}$ are between about 1 and 100 milliseconds.

17. The method of claim 11, wherein said intensity for each exposure is substantially constant throughout said method.

18. The method of claim 17, wherein said intensity for each exposure is about 1,000 to 50,000 watts/cm².

* * * * *